(12) United States Patent
Fujii

(10) Patent No.: US 9,139,381 B2
(45) Date of Patent: Sep. 22, 2015

(54) TRANSPORT APPARATUS AND VACUUM SYSTEM

(75) Inventor: Yoshinori Fujii, Susono (JP)

(73) Assignee: ULVAC, INC., Chigasaki-Shi (JP)

(*) Notice: Subject to any disclaimer, the term of this patent is extended or adjusted under 35 U.S.C. 154(b) by 74 days.

(21) Appl. No.: 13/982,925

(22) PCT Filed: Mar. 16, 2012

(86) PCT No.: PCT/JP2012/056844
§ 371 (c)(1),
(2), (4) Date: Jul. 31, 2013

(87) PCT Pub. No.: WO2012/124803
PCT Pub. Date: Sep. 20, 2012

(65) Prior Publication Data
US 2013/0343840 A1    Dec. 26, 2013

(30) Foreign Application Priority Data
Mar. 16, 2011 (JP) .................... 2011-057977

(51) Int. Cl.
*B65G 49/00* (2006.01)
*H01L 21/67* (2006.01)
*H01L 21/677* (2006.01)
*H01L 21/68* (2006.01)

(52) U.S. Cl.
CPC .......... *B65G 49/00* (2013.01); *H01L 21/67259* (2013.01); *H01L 21/67742* (2013.01); *H01L 21/681* (2013.01)

(58) Field of Classification Search
CPC ................. H01L 21/67259; H01L 21/67742; H01L 21/681
USPC ................. 414/217, 222.01, 222.07
See application file for complete search history.

(56) References Cited

U.S. PATENT DOCUMENTS

| | | | |
|---|---|---|---|
| 6,339,730 B1* | 1/2002 | Matsushima | 700/218 |
| 6,556,887 B2* | 4/2003 | Freeman et al. | 700/218 |
| 6,629,053 B1* | 9/2003 | Mooring | 702/94 |
| 2004/0055397 A1* | 3/2004 | Kurita | 73/862.046 |
| 2008/0101912 A1* | 5/2008 | Martin et al. | 414/935 |
| 2010/0256811 A1* | 10/2010 | Fujii | 700/253 |

FOREIGN PATENT DOCUMENTS

| | | |
|---|---|---|
| JP | 10-064971 | 3/1998 |
| JP | 2001-110873 | 4/2001 |
| JP | 2008-147631 | 6/2008 |
| JP | 2008-300648 | 12/2008 |
| JP | 2008-306162 | 12/2008 |
| JP | 2010-162611 | 7/2010 |
| WO | 2009/038164 | 3/2009 |

OTHER PUBLICATIONS

International Search Report from corresponding PCT Application No. PCT/JP2012/056844 dated May 29, 2012. English translation attached.

* cited by examiner

*Primary Examiner* — Kaitlin Joerger
(74) *Attorney, Agent, or Firm* — Grossman, Tucker, Perreault & Pfleger, PLLC

(57) ABSTRACT

A transport apparatus that supports and moves a substrate by using a robot hand between a plurality of chambers includes a first detection unit that detects the substrate, in a first stop position of the robot hand, using a first detection position set on one surface of the substrate supported by the robot hand, and a second detection unit that detects the substrate, in a second stop position of the robot hand, using a second detection position set on the one surface of the substrate supported by the robot hand.

18 Claims, 9 Drawing Sheets

TRANSPORT APPARATUS AND VACUUM SYSTEM

CROSS-REFERENCE TO RELATED APPLICATION

This is the U.S. National Phase Application under 35 U.S.C. §371 of International Patent Application No. PCT/JP2012/056844 filed Mar. 16, 2012, which designated the United States and was published in a language other than English, which claims the benefit of Japanese Patent Application No. P2011-57977 filed on Mar. 16, 2011, both of which are incorporated by reference herein.

TECHNICAL FIELD

The present invention relates to a transport apparatus that supports and transports a substrate by using a robot hand, and a vacuum system including the same, and more particularly, to a technology for detecting a position shift, damage, or the like of the substrate supported by the robot hand.

BACKGROUND ART

As a multi chamber-type vacuum system, for example, a chemical vapor deposition (CVD) apparatus with chambers such as a loading and unloading chamber and a processing chamber that surround a transport apparatus which is arranged in the center thereof is known. The transport apparatus constituting such a CVD apparatus includes a stretchable robot arm, which has a robot hand at one end thereof to support a substrate (a transportation target).

Allowing the robot arm to be rotatable, makes it possible to transport the substrate between a plurality of such chambers, for example, by rotating the robot arm to guide the substrate from one to another of the chambers after extending the robot arm in the chamber to accept the substrate with the robot hand or withdrawing the robot arm to take out the substrate from the chamber.

In the related art, a configuration is known in which the presence of the substrate is detected using a light emitting and receiving element in such a transport apparatus to determine whether the substrate is mounted on the robot hand or not, the middle (center) of the substrate, for example, serving as a detection position (for example, refer to Patent Document 1).

However, in a configuration in which only one point (for example, the center) of the substrate serves as the detection position to detect the presence of the substrate, it is possible to detect the presence of the substrate on the robot hand but it is impossible to detect a more accurate state of the substrate, such as whether the substrate is supported at a predetermined position of the robot hand or not (position shift detection) and whether the substrate supported by the robot hand is damaged or not (damage detection).

Accordingly, a transport apparatus is known in which, for example, a plurality of detection positions are set on the substrate, and a plurality of detection units, such as the light emitting and receiving element, are provided toward the plurality of detection positions (for example, refer to Patent Document 2). In the transport apparatus, the robot hand has respective detection units for respective stop positions that face the respective chambers, the number of the detection units being equal to the number of the detection positions that are set. By setting the plurality of detection positions with respect to one substrate, it is possible to detect a shift in the position where the substrate is supported on the robot hand and to detect a defect in the substrate.

Specifically, for example, the detection positions are set as three points on a concentric circle of the substrate which are shifted by 120° each, and light (detection light) is applied toward the three-point detection positions at each of the stop positions that face the respective chambers, or a sensor is provided to receive the light. Therefore, for example, in a vacuum system including six chambers around the transport apparatus, three sensors are provided at each of six stop positions, and 18 sensors are provided in total.

CITATION LIST

Patent Document

[Patent Document 1] Japanese Unexamined Patent Application, First Publication No. 2010-162611
[Patent Document 2] Republished Japanese Translation No. 2009-038164 of the PCT International Publication for Patent Applications

SUMMARY OF INVENTION

Technical Problem

However, in a configuration in which the same number of detection units are provided as the number of stop positions of a robot hand which is set, that is, the number of respective detection positions set on a substrate for each chamber that is provided, the number of the detection units of the substrate increases as the number of chambers increases, and thus a space is necessary to provide a number of the detection units. Therefore, it is difficult to reduce the size of an entire vacuum system.

Also, as the number of the detection units significantly increases, the cost for installing the detection units significantly increases. Therefore, it is difficult to reduce the cost of manufacturing the vacuum system.

In addition, signal processing for controlling the detection unit increases as the number of the detection units increases, causing the vacuum system to be complex in structure.

The present invention is made in order to solve the above problems and an object thereof is to provide a transport apparatus and a vacuum system that are capable of reliably detecting a position shift and damage of the substrate while having a small number of detection means that detect the substrate so that the cost and size can be reduced.

Solution to Problem

In order to solve the above problems, the present invention adopts the transport apparatus and the vacuum system as follows:

(1) According to an aspect of the present invention, there is provided a transport apparatus that supports and moves a substrate by using a robot hand between a plurality of chambers, including a first detection unit that detects the substrate, in a first stop position of the robot hand, using a first detection position set on one surface of the substrate supported by the robot hand, and a second detection unit that detects the substrate, in a second stop position of the robot hand, using a second detection position set on the one surface of the substrate supported by the robot hand.

(2) In the transport apparatus according to the aspect (1), the second stop position may be a position where the robot hand pivots from the first stop position about a rotating shaft.

(3) In the transport apparatus according to the aspect (1) or (2), the chamber may include a loading and unloading chamber that allows the substrate to move in and out, and a processing chamber that processes the substrate, the first stop position may be a position where the robot hand stops when the substrate is moved in and out with respect to the loading and unloading chamber, and the second stop position may be a position where the robot hand stops when the substrate is moved in and out with respect to the processing chamber.

(4) In the transport apparatus according to any one of the aspects (1) to (3), the substrate may be a disk-shaped wafer, the first detection position and the second detection position may be set concentrically on the one surface of the substrate, the first detection position may be constituted by two detection points that separate an approximately 120° angle from each other, and the second detection position may be constituted by one detection point that separates an approximately 120° angle from the first detection positions.

(5) In the transport apparatus according to the aspect (4), a plurality of the loading and unloading chamber constituting the chamber may be formed, the loading and unloading chambers being adjacent to each other, and both one of the two detection points constituting the first detection position and one of the two detection points of the first detection position adjacent to each other may be detected by the single first detection unit.

(6) In the transport apparatus according to any one of the aspects (1) to (5), the first detection unit and the second detection unit may include a light emitting unit that emits light toward the substrate, and a light receiving unit that receives the light from the light emitting unit.

(7) In the transport apparatus according to any one of the aspects (1) to (6), the robot hand may have an opening that exposes the one surface of the substrate with respect to the second detection unit.

(8) According to another aspect of the present invention, there is provided a vacuum system, including the transport apparatus according to any one of the aspects (1) to (7), and a plurality of chambers.

(9) In the vacuum system according to the aspect (8), the first detection unit and the second detection unit may measure a position shift amount of the substrate supported by the robot hand with respect to a predetermined substrate support position set in the robot hand.

(10) In the vacuum system according to the aspect (9), the first detection unit and the second detection unit may include a line sensor.

Advantageous Effects of Invention

According to the transport apparatus and the vacuum system related to the above aspects of the present invention, it is unnecessary to provide the number of detection units corresponding to all of the first detection positions and the second detection positions that are set on the substrate at the respective first stop positions and second stop positions of the robot hand which passes the substrate with respect to the respective chambers constituting the vacuum system.

In other words, only the first detection units that correspond to the first detection positions set on the substrate are formed at the first stop positions, and only the second detection unit that corresponds to the second detection position set on the substrate is formed at the second stop positions so that the presence of the substrate can be detected by both the first detection positions and the second detection position using the first detection units and the second detection unit that detect the substrate at different detection positions before and after the transportation.

Therefore, the space required for the installation of the detection units can be decreased to allow the entire vacuum system to be reduced in size. Also, since it is possible to significantly reduce the cost required to install the detection units, it is possible to realize the vacuum system at a reduced cost. Furthermore, it is possible to simplify signal processing for control of the detection units because of the reduction in the detection units, and therefore it is possible to simplify the configuration of a control unit of the vacuum system.

DESCRIPTION OF EMBODIMENTS

Figure 1:
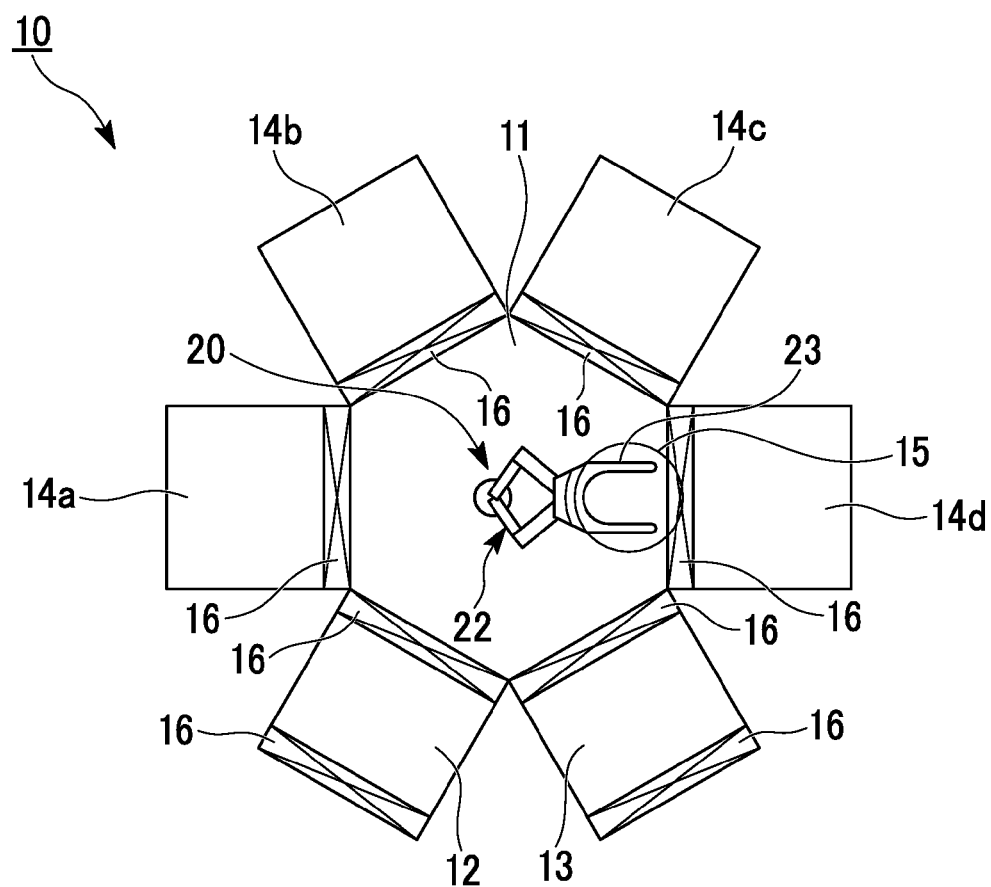
FIG. 1 is a plan view showing a configuration example of a vacuum system including a transport apparatus of an embodiment according to the present invention.

Hereinafter, a transport apparatus and a vacuum system according to embodiments of the present invention will be described referring to the accompanying drawings. The embodiments are described using an example for further understanding the spirit of the present invention, and therefore the present invention is not limited thereto unless otherwise specified. Also, in the drawings used in the following description, the sizes of the main sections may be exaggerated for convenience and further understanding of the present invention, and the dimensional ratio of each component and the like is not necessarily to scale.

FIG. 1 is a plan view showing a configuration example of a vacuum system including a transport apparatus of an embodiment according to the present invention.

A multi chamber-type vacuum system 10 includes a transport chamber 11, and a transport apparatus (transport robot) 20 and is disposed inside the transport chamber 11. The transport apparatus 20 transports, for example, a disk-shaped substrate 15 on which processing is performed by the vacuum system 10.

A plurality of chambers are formed around the transport chamber 11 so as to surround the transport chamber. The chambers may be constituted by, for example, two loading and unloading chambers (chambers) 12 and 13 configured to be adjacent to each other, and a plurality of processing chambers (chambers) 14a to 14d. Of the loading and unloading chambers (chambers) 12 and 13, for example, one loading and unloading chamber 12 may be a loading chamber that carries the substrate 15 from outside toward the vacuum system 10, and the other loading and unloading chamber 13 may be an unloading chamber that carries the substrate 15 from the vacuum system 10 outside.

Partition valves 16 may be formed between the respective chambers 12, 13, and 14a to 14d and the transport chamber 11, and between the loading and unloading chambers (chambers) 12 and 13 and the outside.

The transport apparatus 20 is capable of moving the substrate 15 that is a transportation target between the chambers 12, 13, and 14a to 14d.

Figure 2A:
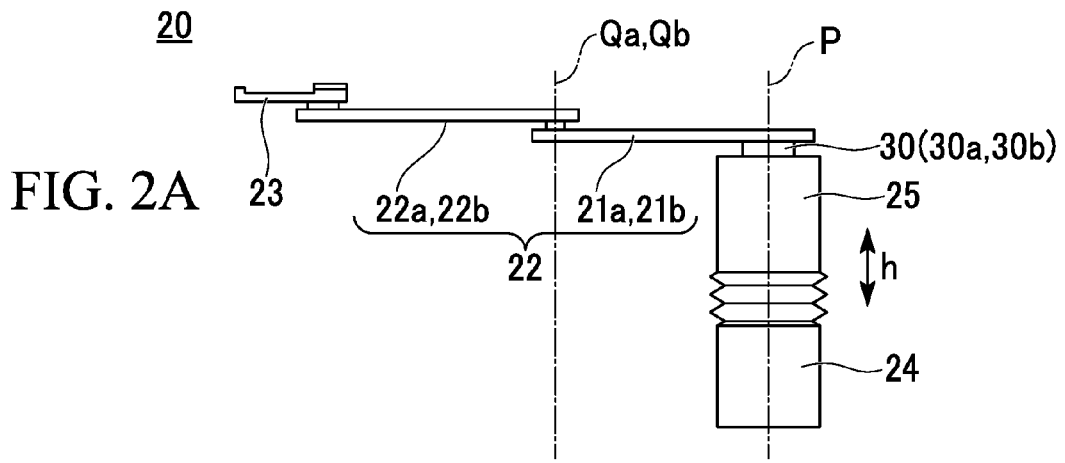
FIG. 2A is a side view of the same transport apparatus.
Figure 2B:
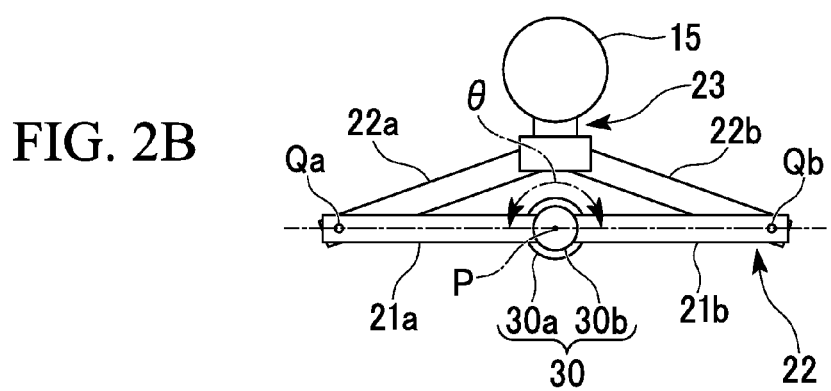
FIG. 2B is a plan view of the same transport apparatus.
Figure 2C:
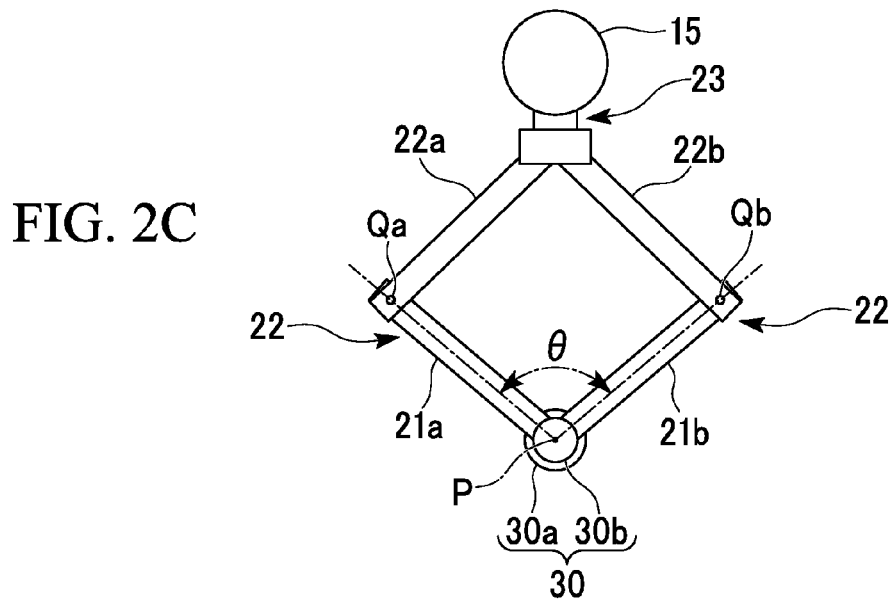
FIG. 2C is a plan view of the same transport apparatus.

FIG. 2A is a side view of the transport apparatus (transport robot) 20. FIGS. 2B and 2C are plan views seen from a ceiling side of the transport chamber 11. The transport apparatus 20 includes a rotating shaft 30, a robot arm 22 that is mounted on the rotating shaft, a robot hand 23 that is formed at one end of the robot arm 22, and a vertical motion device 24. The robot arm 22 is constituted by first and second active arms 21a and 21b, and first and second driven arms 22a and 22b bendable with respect to each other.

The rotating shaft 30 is constituted by an outer cylinder 30a, and an inner cylinder 30b that is disposed inside the external cylinder 30a. The external cylinder 30a and the internal cylinder 30b are connected to a concentric two-axis motor 25, and are configured so as to be capable of rotating independently from each other about the same rotation axis P.

The vertical motion device 24 moves movable units, such as the active arm 21a and 21b, the driven arm 22a and 22b, and the hand (robot hand) 23, vertically along a height direction h.

One of root portions of the first and second active arms 21a and 21b is fixed to the outer cylinder 30a, and the other of the root portions thereof is fixed to the inner cylinder 30b. Herein, the first active arm 21a is fixed to the outer cylinder 30a, and the second active arm 21b is fixed to the inner cylinder 30b. Root portions (the concentric two-axis motor 25 side) of the first and second driven arms 22a and 22b are rotatably mounted on tip end portions (the robot hand 23 side) of the first and second active arms 21a and 21b, respectively.

The rotation axis P is disposed vertically, and the first and second active arms 21a and 21b and the first and second driven arms 22a and 22b are disposed horizontally. Therefore, the first and second active arms 21a and 21b and the first and second driven arms 22a and 22b are movable in a horizontal plane.

Signs Qa and Qb illustrate first and second pivot axes that are centers of pivoting of the first and second driven arms 22a and 22b with respect to the first and second active arms 21a and 21b. The distance between the first pivot axis Qa and the rotation axis P is configured to be the same as the distance between the second pivot axis Qb and the rotation axis P.

By the configuration described above, the robot hand 23 that supports the substrate 15 is rotatable about the rotation axis P, and is capable of moving horizontally in a direction that is away from the rotation axis P. Also, the robot hand 23 is capable of being moved vertically in the height direction h by the vertical motion device 24. In other words, the robot hand 23 is capable of freely moving in three dimensional directions of XYZ within a predetermined range. Therefore, it is possible to freely move the substrate 15 that is the transportation target between the transport chamber 11 and the respective chambers 12, 13, and 14a to 14d (refer to FIG. 1).

Figure 3:
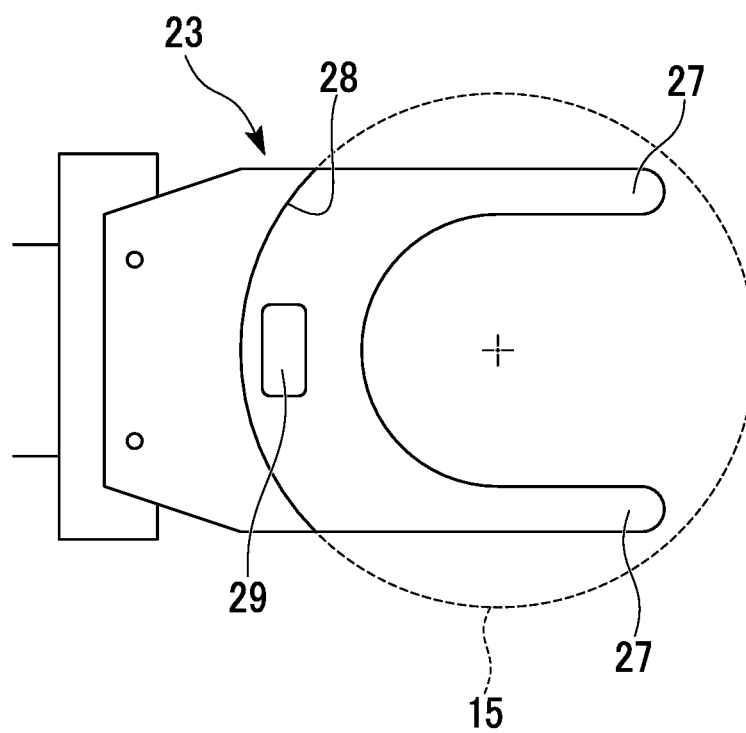
FIG. 3 is an enlarged plan view showing a robot hand that supports a substrate.

FIG. 3 is an enlarged plan view showing the robot hand that supports the substrate.

The robot hand 23 is provided with a fork 27 on which the substrate 15 is placed, and a supporting end 28 which is configured to have the same curvature as a circumferential surface of the substrate 15, and is positioned in contact with a circumferential edge of the substrate 15 when the substrate 15 is supported. Also, in a vicinity of the supporting end 28 of the robot hand 23, an opening 29 is formed so as to expose one surface of the substrate 15 with respect to a second detection unit that will be described later.

The substrate 15 that is supported by the robot hand 23 may be, for example, a silicon wafer. At a portion of the circumferential edge (edge) of the substrate 15, a notch N is formed which is a crystal orientation mark of the substrate 15.

Figure 4:
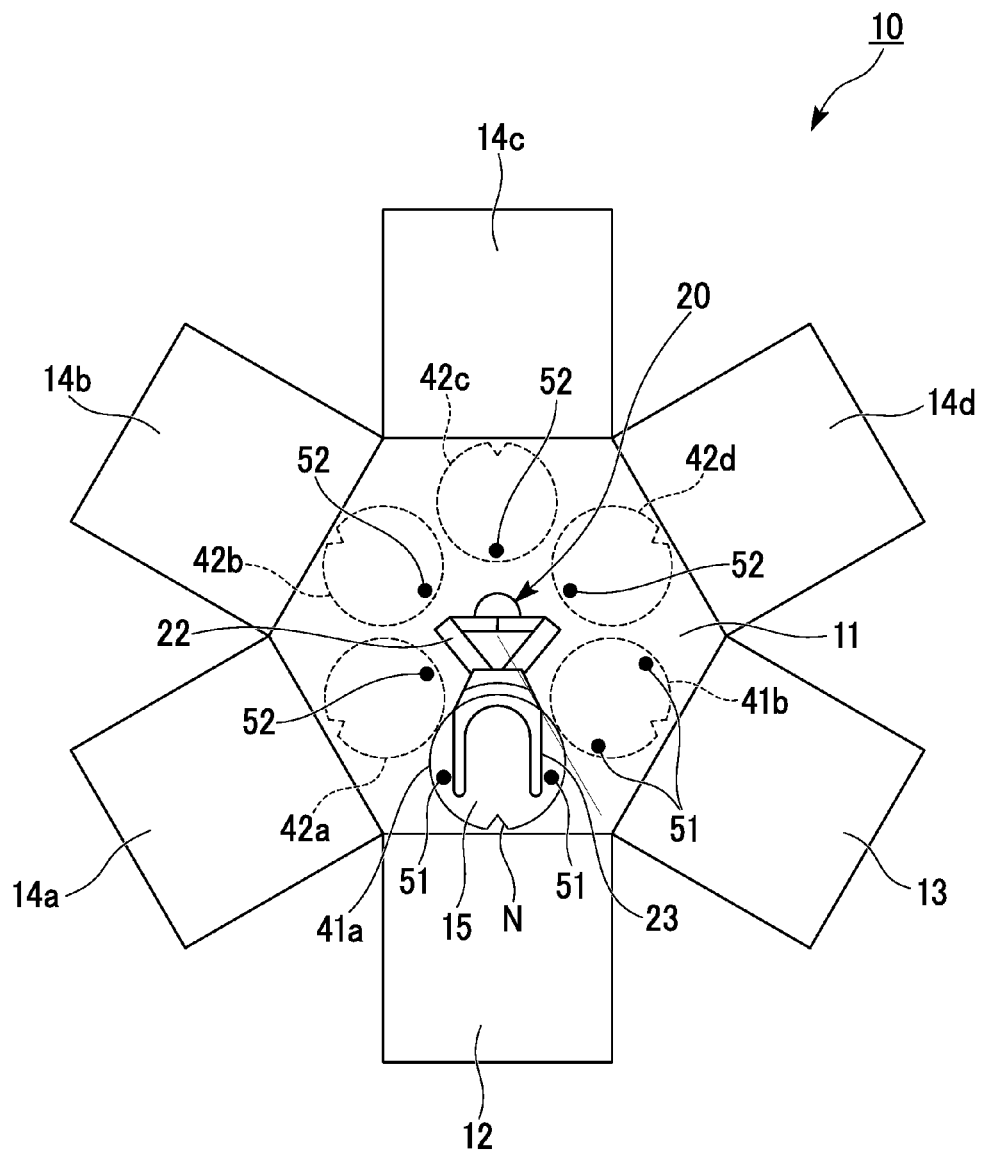
FIG. 4 is an enlarged plan view showing a vicinity of a transport chamber.

FIG. 4 is an enlarged plan view showing a vicinity of the transport chamber.

In the transport apparatus 20, six stop positions are set as stop positions of the robot hand 23 that pivots about the rotating shaft 30, the six stop positions being first stop positions 41a and 41b and second stop positions 42a, 42b, 42c, and 42d. Also, in FIG. 4, the stop positions 41b, and 42a to 42d are illustrated as positions of the substrate 15 that is supported by the robot hand 23 of the robot arm 22 in a contracted state (refer to FIG. 2B).

Of the stop positions 41a, 41b, and 42a to 42d, the first stop position 41a is the stop position that faces the loading and unloading chamber 12, and the first stop position 41b is the stop position that faces the loading and unloading chamber 13. Also, the second stop positions 42a to 42d are the stop positions that respectively face the processing chambers 14a to 14d.

Figure 5:
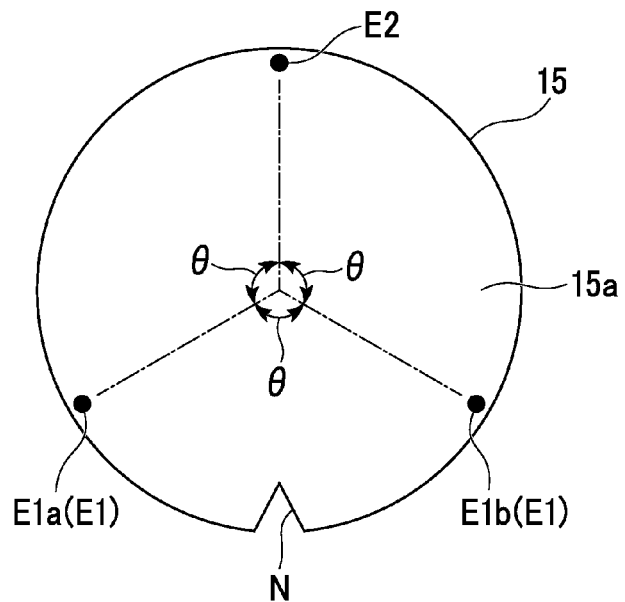
FIG. 5 is an explanatory view showing an example of a detection position that is set on the substrate.

As shown in FIG. 5, on one surface 15a of the substrate 15 that is supported by the robot hand 23, for example, two first detection positions E1 and one second detection position E2 are set. The first detection positions E1 and the second detection position E2 are, for example, detection points that are set at positions equally spaced from each other on a certain concentric circle based on the notch N of the substrate 15. The first detection positions and the second detection position form a predetermined angle θ with each other, θ being 120°, for example.

For example, the two first detection positions E1a and E1b that are set on the one surface 15a of the substrate 15 may be formed at positions where the notch N is interposed therebetween. Also, the second detection position E2 may be set in the vicinity of the edge opposing the position where the notch N is formed.

Referring back to FIG. 4, in the first stop position 41a that faces the loading and unloading chamber 12 and in the first stop position 41b that faces the loading and unloading chamber 13, first detection units 51 are formed to detect the presence of the substrate 15 at the first detection positions E1 set on the substrate 15.

In the second stop positions 42a to 42d that respectively face the processing chambers 14a to 14d, a second detection unit 52 is formed to detect the presence of the substrate 15 at the second detection position E2 set on the substrate 15.

Figure 6:
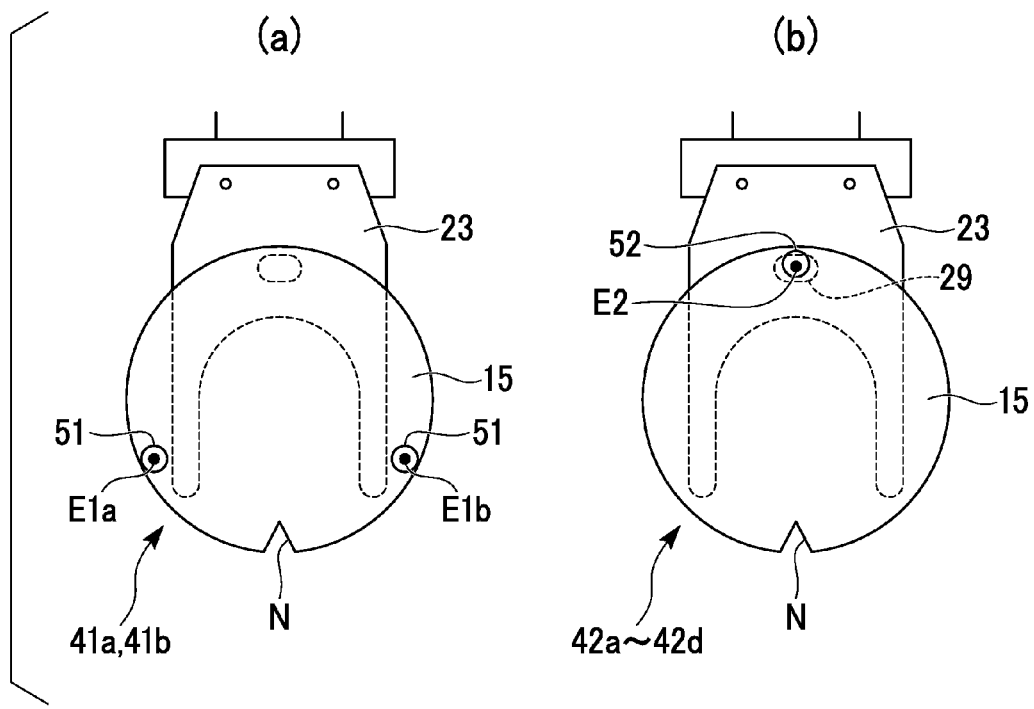
FIG. 6 is a plan view showing an operation of the same transport apparatus.

As shown in FIG. 6A, in the first stop positions 41a and 41b, the first detection units 51 are provided at positions that face the two first detection positions E1a and E1b which are set on the substrate 15, so as to respectively detect the presence of the substrate 15.

Also, as shown in FIG. 6B, in the second stop positions 42a to 42d, the second detection unit 52 is provided at a position that faces the one second detection position E2 which is set on the substrate 15, so as to detect the presence of the substrate 15 through the opening 29 of the robot hand 23.

Accordingly, when the substrate 15 that is placed on the robot hand 23 is transported via any of the first stop positions 41a and 41b and any of the second stop positions 42a to 42d, the presence of the substrate 15 is detected using the different detection positions on the substrate 15, that is, the three detection positions.

Figure 7:
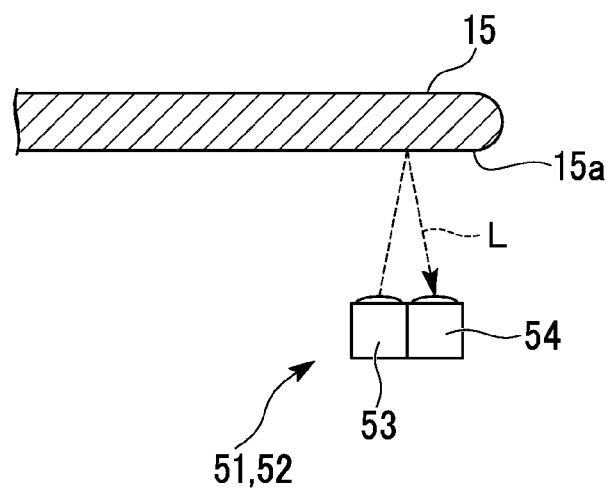
FIG. 7 is a cross-sectional view showing an example of a detection unit.

FIG. 7 is a side cross-sectional view showing a configuration example of the first detection unit and the second detection unit that are formed at the first stop position and the second stop position.

Each of the first detection units 51 and the second detection unit 52 is constituted by a light emitting unit 53 that emits light toward the substrate 15, and a light receiving unit 54 that receives the light from the light emitting unit 53. In a case where the substrate 15 is at the first stop positions 41a and 41b and the second stop positions 42a to 42d (refer to FIG. 4) (that is, in a case where the robot hand 23 (refer to FIG. 4) on which the substrate 15 is placed is stopped), light (detection light) L that is emitted from the light emitting unit 53 is reflected by the first detection positions E1 and the second detection position E2 (refer to FIG. 5) that are set on the one surface 15a of the substrate 15, and the light is incident on the light receiving unit 54 so that the presence of the substrate 15 is detected.

In a case where the substrate 15 is absent, or in a case where the substrate is shifted away from an optical path of the light emitting unit 53, the light (detection light) L is not reflected by the substrate 15, and thus the light is not detected by the light receiving unit 54. The light emitting unit 53 and the light receiving unit 54 may be constituted by, for example, a combination of a light source such as a light emitting diode (LED), and a light receiving sensor. Alternatively, the light emitting unit and the light receiving unit may also be constituted by an ultrasonic transmitting and receiving element.

Also, in a specific example of the first detection units 51 and the second detection unit 52, a line sensor may be used which is represented by, for example, a retroreflective-type fiber sensor, a transmission-type fiber sensor linearly spreading irradiation light, or a retroreflective-type fiber sensor linearly spreading irradiation light, so as to be capable of detecting the presence of the substrate 15 and a position thereof in a predetermined range of irradiation width. For example, the line sensor or the like is installed in such a manner that the substrate blocks 50% of light. In this case, when the substrate is checked, a numerical value of the line sensor is determined to be OK when the value is in a range of 50%±10%, and is determined to be NG when the value is out of the range of 50%±10%. Thus, not only a decrease in a light blocking amount caused by cracking or chipping of the substrate but also an increase in a shielding amount caused by a shift in a substrate support position with respect to the robot hand can be detected.

Furthermore, if a sensor value and a substrate shift amount are quantified in advance, it is possible to obtain a substrate position shift amount, and thus, based on the substrate position shift amount that is obtained, it is possible to correct a robot hand transport position in a direction in which the substrate shift amount is reduced and then to perform transportation.

Figure 8:
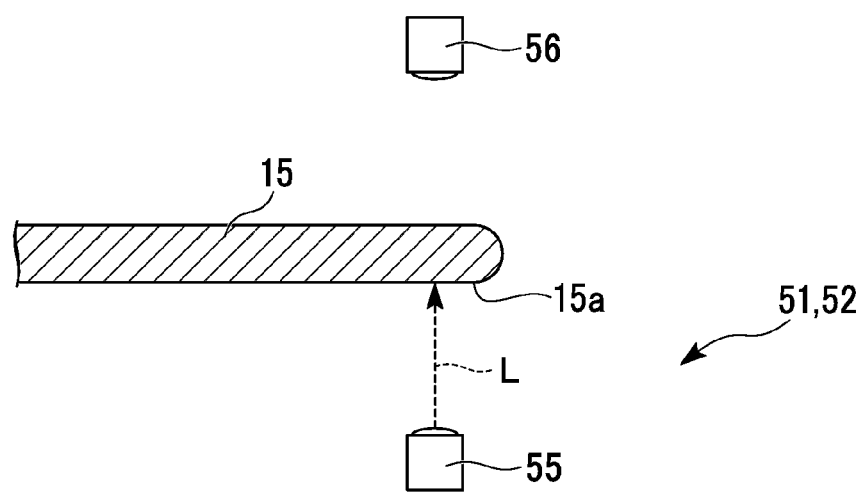
FIG. 8 is a cross-sectional view showing an example of a detection unit.

FIG. 8 is a side cross-sectional view showing another configuration example of the first detection unit and the second detection unit that are formed at the first stop position and the second stop position.

Each of the first detection units 51 and the second detection unit 52 is constituted by a light emitting unit 55 that emits light toward the substrate 15, and a light receiving unit 56 that is disposed so as to oppose the light emitting unit 55. In a case where the substrate 15 is at the first stop positions 41a and 41b and the second stop positions 42a to 42d (refer to FIG. 4) (that is, in a case where the robot hand 23 (refer to FIG. 4) on which the substrate 15 is placed is stopped) light (detection light) L that is emitted from the light emitting unit 55 is reflected by the first detection positions E1 and the second detection position E2 (refer to FIG. 5) that are set on the one surface 15a of the substrate 15, and the light is not incident on the light receiving unit 56 so that the presence of the substrate 15 is detected. In a case where the substrate 15 is absent, or in a case where the substrate is shifted away from an optical path of the light emitting unit 55, the light (detection light) L is incident on the light receiving unit 56.

An effect of the vacuum system that includes the transport apparatus according to this embodiment having the above-described configuration will be described.

Figure 9:
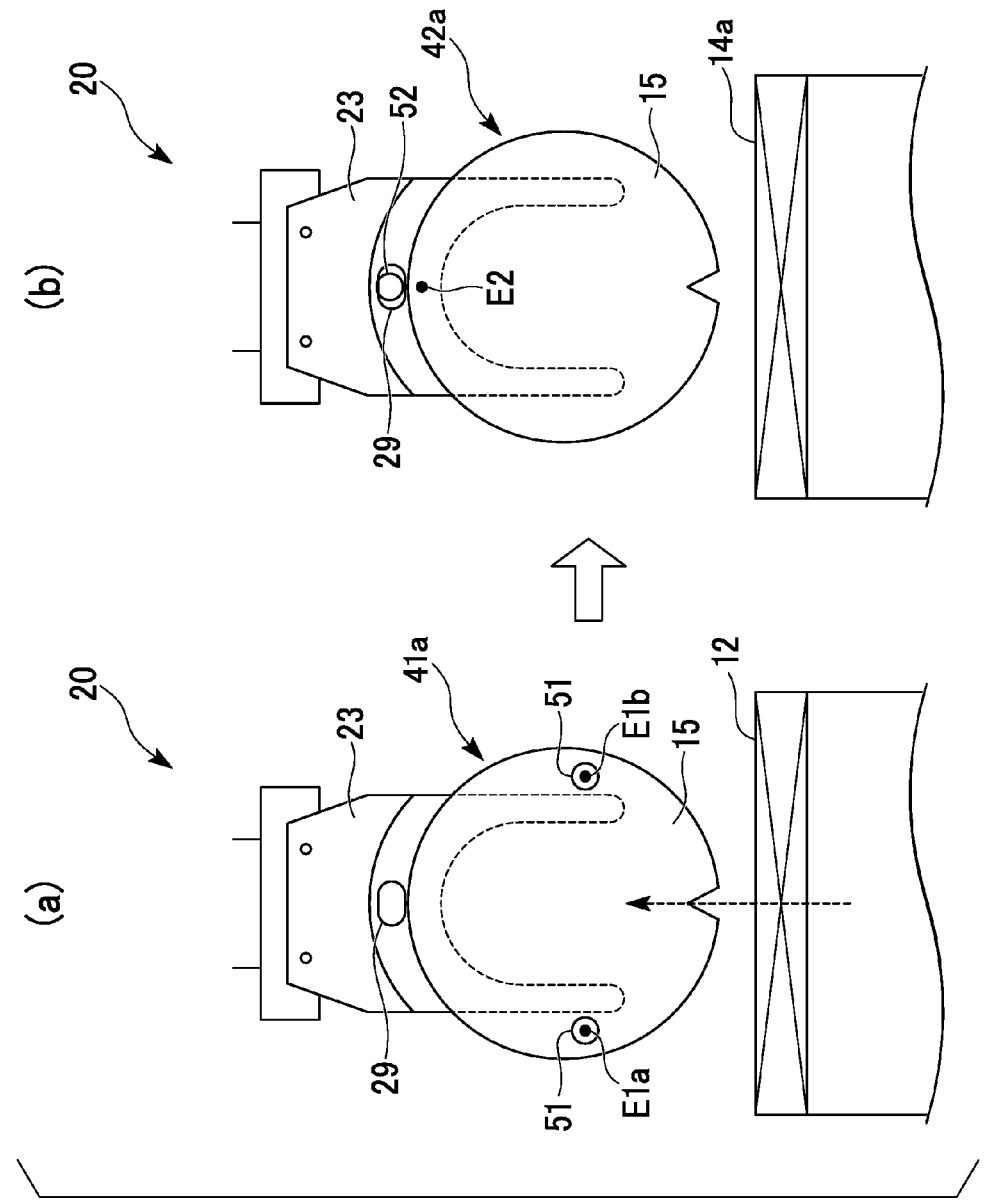
FIG. 9 is a plan view showing an effect of the same transport apparatus.

FIG. 9 is an explanatory view showing the effect of the transport apparatus according to this embodiment.

As an example of a movement of the transport apparatus, an operation at the time of moving the substrate 15 that is accommodated in the loading and unloading chamber 12 to the processing chamber 14a will be described.

The robot hand 23 that constitutes the transport apparatus 20 faces the loading and unloading chamber 12, the substrate 15 is placed on the robot hand 23 as the robot arm 22 extends, and the robot arm 22 contracts so that the robot hand 23 on which the substrate 15 is placed moves to the first stop position 41a that faces the loading and unloading chamber 12.

At this time, it is assumed that the substrate 15 placed on the robot hand 23 is supported in a shifted manner in a tip end direction of the robot hand 23. The respective first detection units 51 and 51 that correspond to the first detection positions E1a and E1b which are set on the substrate 15 located at the first stop position 41a in this state detect the presence of the substrate 15 (refer to FIG. 9A).

Next, when the robot hand 23 that constitutes the transport apparatus 20 pivots to reach the second stop position 42a that faces the processing chamber 14a, the detection of the substrate 15 is performed by the second detection unit 52 that corresponds to the second detection position E2 set on the substrate 15. However, since the substrate 15 is supported in a shifted manner in the tip end direction of the robot hand 23, the second detection unit 52 and the second detection position E2 set on the substrate 15 do not have vertically overlapping positions (refer to FIG. 9B).

Therefore, the presence of the substrate 15 is not confirmed despite the robot hand 23 being located at the second stop position 42a. Although the presence of the substrate 15 is confirmed by the first detection units 51 and 51, the presence thereof is not confirmed (confirmed not to be present) by the second detection unit 52. Accordingly, it is possible to detect that the substrate 15 is not placed on a predetermined position but is shifted in position.

Figure 10:
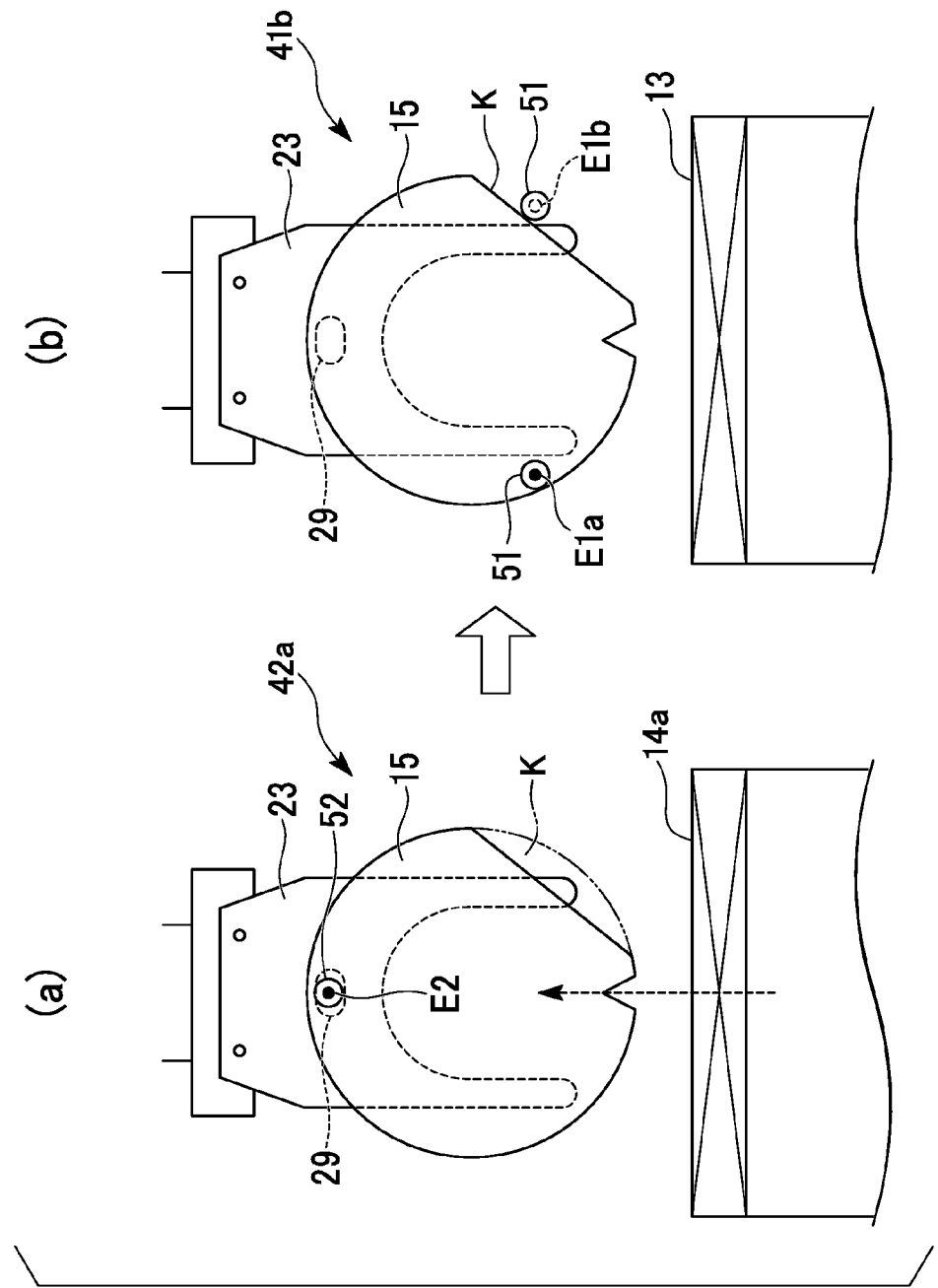
FIG. 10 is a plan view showing an effect of the same transport apparatus.

FIG. 10 is an explanatory view showing the effect of the transport apparatus according to this embodiment.

As another example of a movement of the transport apparatus, an operation at the time of moving the substrate 15 on which, for example, a film formation process is performed in the processing chamber 14a to the loading and unloading chamber 13 will be described.

The robot hand 23 that constitutes the transport apparatus 20 faces the processing chamber 14a, the processed substrate 15 is placed on the robot hand 23 as the robot arm 22 extends, and the robot arm 22 contracts so that the robot hand 23 on which the processed substrate 15 is placed moves to the second stop position 42a that faces the processing chamber 14a.

At this time, it is assumed that a part of the substrate 15 placed on the robot hand 23 is damaged (cracked) (a sign K portion) during the processing in the processing chamber 14a.

The second detection unit 52 that corresponds to the second detection position E2 which is set on the substrate 15 located at the second stop position 42a in this state detects the presence of the substrate 15 (refer to FIG. 10A).

Next, when the robot hand 23 that constitutes the transport apparatus 20 pivots to reach the first stop position 41b that faces the loading and unloading chamber 13, the detection of the presence of the substrate 15 is performed by the first detection units 51 and 51 that correspond to the first detection positions E1a and E1b set on the substrate 15. However, since the part (the sign K portion) of the substrate 15 is lost, the presence of the substrate 15 is not detected (refer to FIG. 10B) at the first detection position E1b which, under normal circumstances, would be located at a position vertically overlapping with one of the first detection units 51 and 51.

Therefore, in one first detection unit 51 of the two first detection units 51 and 51, the presence of the substrate 15 is not confirmed (confirmed not to be present) despite the robot hand 23 being located at the first stop position 41b. Accordingly, it is possible to detect a possibility of the part of the substrate 15 being damaged.

As described above, according to the transport apparatus 20 and the vacuum system 10 of this embodiment including the same, it is unnecessary to provide the number of detection units corresponding to all of the first detection positions E1 and the second detection positions E2 that are set on the substrate 15 at the respective first stop positions 41a and 41b and second stop positions 42a to 42d of the robot hand 23 which passes the substrate 15 with respect to the respective chambers 12, 13, and 14a to 14d constituting the vacuum system 10.

In other words, only the first detection units 51 that correspond to the first detection positions E1 set on the substrate 15 are formed at the first stop positions 41a and 41b, and only the second detection unit 52 that corresponds to the second detection position E2 set on the substrate 15 is formed at the second stop positions 42a to 42d so that the presence of the substrate 15 can be detected by a plurality of first detection positions E1 and the second detection position E2 using the first detection units 51 and the second detection unit 52 that detect the substrate 15 at different detection positions before and after the transportation.

Accordingly, it is possible to significantly reduce the number of the detection units, for example, optical sensors, to be installed in the entire transport apparatus 20. For example, in the vacuum system 10 having the configuration shown in FIG. 4, previously three substrate detection units are formed at each of the six stop positions corresponding to the six chambers, and therefore a total of 18 optical sensors are necessary. However, in this embodiment, two optical sensors are installed at each of the two first stop positions, and one optical sensor is installed at each of the four second stop positions so that a total of eight optical sensors are installed to be capable of constituting the transport apparatus having the same level of substrate detection accuracy as before.

Therefore, the space required for the installation of the detection units can be decreased to allow the entire vacuum system to be reduced in size.

Also, since it is possible to significantly reduce the cost required to install the detection units, it is possible to realize the vacuum system at a reduced cost.

Furthermore, it is possible to simplify signal processing for control of the detection units because of the reduction of the detection units, and therefore it is possible to simplify the configuration of a control unit of the vacuum system.

Also, in the embodiment described above, three detection positions are set on the substrate 15, two detection units are set at each of the two first stop positions 41a and 41b, and one detection unit is set at each of the four second stop positions 42a to 42d. However, such a combination is an example, and the present invention is not limited thereto.

For example, it is possible to set four detection positions on the substrate, three detection units at each of the two first stop positions, and one detection unit at each of the four second stop positions. It is possible to constitute the transport apparatus using any combination.

Figure 11:
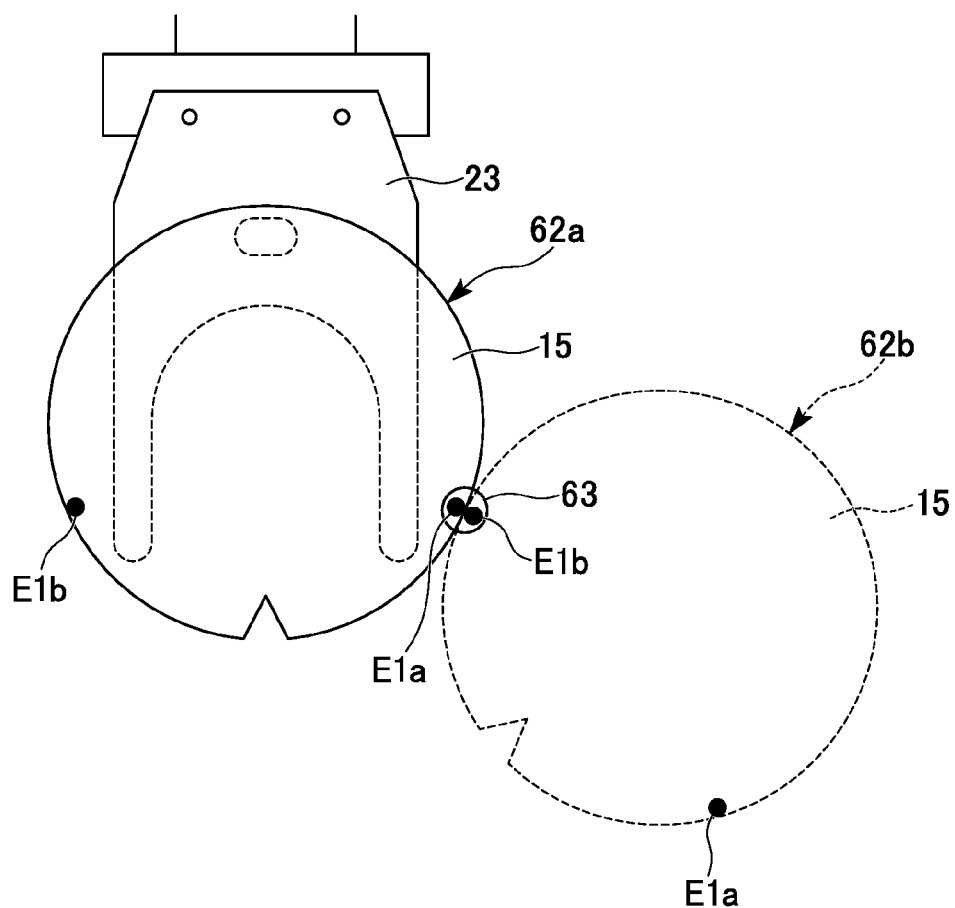
FIG. 11 is a plan view showing another embodiment of the transport apparatus according to the present invention.

FIG. 11 is an enlarged plan view showing another embodiment of the transport apparatus according to the present invention.

According to a transport apparatus 60 of this embodiment, for example, in a first stop position 62a of the robot hand 23, both of the first detection position (detection point) E1a, which is one of the first detection positions E1 set on the substrate 15, and the first detection position (detection point) E1b, which is the other of the first detection positions E1 set on the substrate 15 at a first stop position 62b that is adjacent to the first stop position 62a, are used as a single first detection unit 63 capable of detecting the substrate.

In the transport apparatus 60 having such a configuration, it is possible to further reduce the number of optical sensors and the like that constitute the first detection unit 63.

REFERENCE SIGNS LIST

10 VACUUM SYSTEM
20 TRANSPORT APPARATUS
15 SUBSTRATE (TRANSPORTATION TARGET)
23 ROBOT HAND
41a, 41b FIRST STOP POSITION
42a~42d SECOND STOP POSITION
51 FIRST DETECTION UNIT
52 SECOND DETECTION UNIT

What is claimed is:

1. A transport apparatus that supports and moves a substrate by using a robot hand between a plurality of chambers, the transport apparatus comprising:
    a first detection unit that detects the substrate, in a first stop position of the robot hand, using a first detection position set on one surface of the substrate supported by the robot hand; and
    a second detection unit that detects the substrate, in a second stop position of the robot hand, using a second detection position set on the one surface of the substrate supported by the robot hand;
    wherein the substrate is a disk-shaped wafer, the first detection position and the second detection position are set concentrically on the one surface of the substrate; and
    wherein the first detection position is constituted by two detection points that separate from each other and the second detection position is constituted by one detection point that positions at an opposite side of the substrate when seen from an intermediate point of a virtual line connecting the two detection points constituting the first detection position.

2. The transport apparatus according to claim 1,
    wherein the second stop position is a position where the robot hand pivots from the first stop position about a rotating shaft.

3. The transport apparatus according to claim 1,
    wherein the chamber includes a loading and unloading chamber that allows the substrate to move in and out, and a processing chamber that processes the substrate, wherein the first stop position is a position where the robot hand stops when the substrate is moved in and out with respect to the loading and unloading chamber, and wherein the second stop position is a position where the robot hand stops when the substrate is moved in and out with respect to the processing chamber.

4. The transport apparatus according to claim 1,
wherein a plurality of the loading and unloading chambers constituting the chamber is formed, the loading and unloading chambers being adjacent to each other, and wherein both one of the two detection points constituting the first detection position and one of the two detection points of the first detection position adjacent to each other are detected by the single first detection unit.

5. The transport apparatus according to claim 4,
wherein the first detection position is constituted by the two detection points that separate an approximately 120° angle from each other and the second detection position is constituted by the one detection point that separates an approximately 120° angle from the first detection position.

6. The transport apparatus according to claim 1,
wherein the first detection unit and the second detection unit include a light emitting unit that emits light toward the substrate, and a light receiving unit that receives the light from the light emitting unit.

7. The transport apparatus according to claim 1,
wherein the robot hand has an opening that exposes the one surface of the substrate with respect to the second detection unit.

8. A vacuum system, comprising the transport apparatus according to claim 1, and a plurality of chambers.

9. The vacuum system according to claim 8,
wherein the first detection unit and the second detection unit measure a position shift amount of the substrate supported by the robot hand with respect to a predetermined substrate support position set in the robot hand.

10. The vacuum system according to claim 9,
wherein the first detection unit and the second detection unit include a line sensor.

11. The transport apparatus according to claim 2,
wherein the chamber includes a loading and unloading chamber that allows the substrate to move in and out, and a processing chamber that processes the substrate, wherein the first stop position is a position where the robot hand stops when the substrate is moved in and out with respect to the loading and unloading chamber, and wherein the second stop position is a position where the robot hand stops when the substrate is moved in and out with respect to the processing chamber.

12. A vacuum system, comprising the transport apparatus according to claim 2, and a plurality of chambers.

13. A vacuum system, comprising the transport apparatus according to claim 3, and a plurality of chambers.

14. A vacuum system, comprising the transport apparatus according to claim 4, and a plurality of chambers.

15. A vacuum system, comprising the transport apparatus according to claim 5, and a plurality of chambers.

16. A vacuum system, comprising the transport apparatus according to claim 6, and a plurality of chambers.

17. A vacuum system, comprising the transport apparatus according to claim 7, and a plurality of chambers.

18. A vacuum system, comprising the transport apparatus according to claim 11, and a plurality of chambers.

* * * * *